United States Patent [19]

Ahn

[11] Patent Number: 5,097,260
[45] Date of Patent: Mar. 17, 1992

[54] OPERATION CONTROL CIRCUIT WITH SECRET CODE COMPARING MEANS FOR REMOTE CONTROL KEYPAD

[75] Inventor: Yun-soon Ahn, Kyunggi, Rep. of Korea

[73] Assignee: SamSung Electronics Co., Ltd, Kyung, Rep. of Korea

[21] Appl. No.: 396,107

[22] Filed: Aug. 21, 1989

[30] Foreign Application Priority Data

Dec. 1, 1988 [KR] Rep. of Korea ............ 88-20000

[51] Int. Cl.⁵ ............................................. H04B 10/00
[52] U.S. Cl. ......................... 340/825.560; 358/194.1; 359/146
[58] Field of Search ............ 340/825.3, 825.34, 825.56, 340/825.31, 825.69, 825.72; 358/194.1, 188, 349; 455/181, 352, 353; 235/382.5, 487; 359/142, 146

[56] References Cited

U.S. PATENT DOCUMENTS

| | | | |
|---|---|---|---|
| 4,139,864 | 2/1979 | Schulman | 358/349 |
| 4,348,696 | 9/1982 | Beier | 358/349 |
| 4,510,623 | 4/1985 | Bonneau et al. | 358/349 |
| 4,670,747 | 6/1987 | Borras et al. | 340/825.56 |
| 4,712,105 | 12/1987 | Kohler | 340/825.69 |
| 4,718,107 | 1/1988 | Hayes | 358/349 |
| 4,766,746 | 8/1988 | Henderson et al. | 340/825.31 |

Primary Examiner—Donald J. Yusko
Assistant Examiner—Dervis Magistre
Attorney, Agent, or Firm—Robert E. Bushnell

[57] ABSTRACT

An operation control circuit for a remote control keypad having a key operating section, a microcomputer and an oscillator is disclosed which comprises a key operating section, a display means, a secret code comparing means, and a gating means. The device of the present invention is characterized in that the users who are not informed of the secret codes are not allowed to use the device, or are allowed only limited uses of the device, thereby assuring the security of the remote controlled apparatus. There is a further advantage that, without observing the display means to confirm the operation state of the apparatus, the remote control can be carried out only by manipulating the keypad.

16 Claims, 1 Drawing Sheet

OPERATION CONTROL CIRCUIT WITH SECRET CODE COMPARING MEANS FOR REMOTE CONTROL KEYPAD

FIELD OF THE INVENTION

The present invention relates to an operation control circuit for a remote control keypad, and particularly to an operation control circuit for a remote control keypad for use with audio and video apparatuses which can assure the security thereof through the use of a secret code.

BACKGROUND OF THE INVENTION

A remote control keypad is designative of a unit for controlling a passively controlled apparatus at a separated distance, when performing the controls of audio and video apparatuses, turning on/off of general power sources, and opening/closing of general auto doors. Such functions are carried out by adopting a wireless means through the utilization of radio waves or infrared rays.

Usually, the keypad of such a remote controller forms a hand held type, and is provided with a power on/off key, ten keys consisting of numeral keys 0 to 9, and other function keys. A passively controlled apparatus related to the remote control device is activated only by pushing the above mentioned keys, and therefore, there has been a problem of lack of security in using the remote control device.

That is, children can activate the apparatus from a playful motive, thereby possibly causing a damage to the apparatus, or wasting electric power. Further, during the absence of the parent, children can watch a prohibited program, and the use of an apparatus by a third party, which is thought undesirable, can not be prevented.

Meanwhile, in a remote controlled video set, the control state is displayed only through the display panel or OSD (ON SCREEN DISPLAY) of the video apparatus, and therefore, during the remote-controlling of such an apparatus, the keypad and the display state on the video apparatus have to be alternately watched, which is a troublesome feature of the system. Meanwhile, in the case of an audio apparatus, there is no particular display means for showing the activation state, and therefore, after manipulating the remote control pad, the user has to wait to make a judgement on the sound volume and the sound quality, and then the user has to adjust the generated sound to the desired level. This gives the disadvantage that the device can not provide a desirable level of sound from the initial setting.

SUMMARY OF THE INVENTION

The present invention is intended to overcome the above described disadvantages of the conventional devices.

Therefore it is an object of the present invention to provide an operation control circuit for a remote control keypad, in which the passively controlled apparatus can not be activated by an unauthorized person, thereby providing a security feature to the device.

It is another object of the present invention to provide an operation control circuit for a remote control keypad, in which the user can know the operation state of the apparatus without resorting to the display means of the passively controlled apparatus.

In achieving the above objects, the remote control keypad according to the present invention having a key operating section, a microcomputer for outputting operation signals in accordance with the operations of the key operating section, and an oscillator for supplying reference clocks to the microcomputer for use with an audio and video apparatus includes;

a display means for decoding the operation signals of the microcomputer and for displaying them to a display section;

a secret code comparing means for setting secret codes through the key operating section and the microcomputer, and for comparing the set codes and the incoming secret codes; and a gating means for transmitting the operating signals of the microcomputer to a remote control signal receiver of the audio and video apparatus if the two secret codes are found to correspond to each other at the secret code comparing means.

BRIEF DESCRIPTION OF THE DRAWINGS

The above objects and other advantages of the present invention will become more apparent by describing the preferred embodiment of the present invention with reference to the attached drawings in which.

DESCRIPTION OF THE PREFERRED EMBODIMENT

Figure 1:
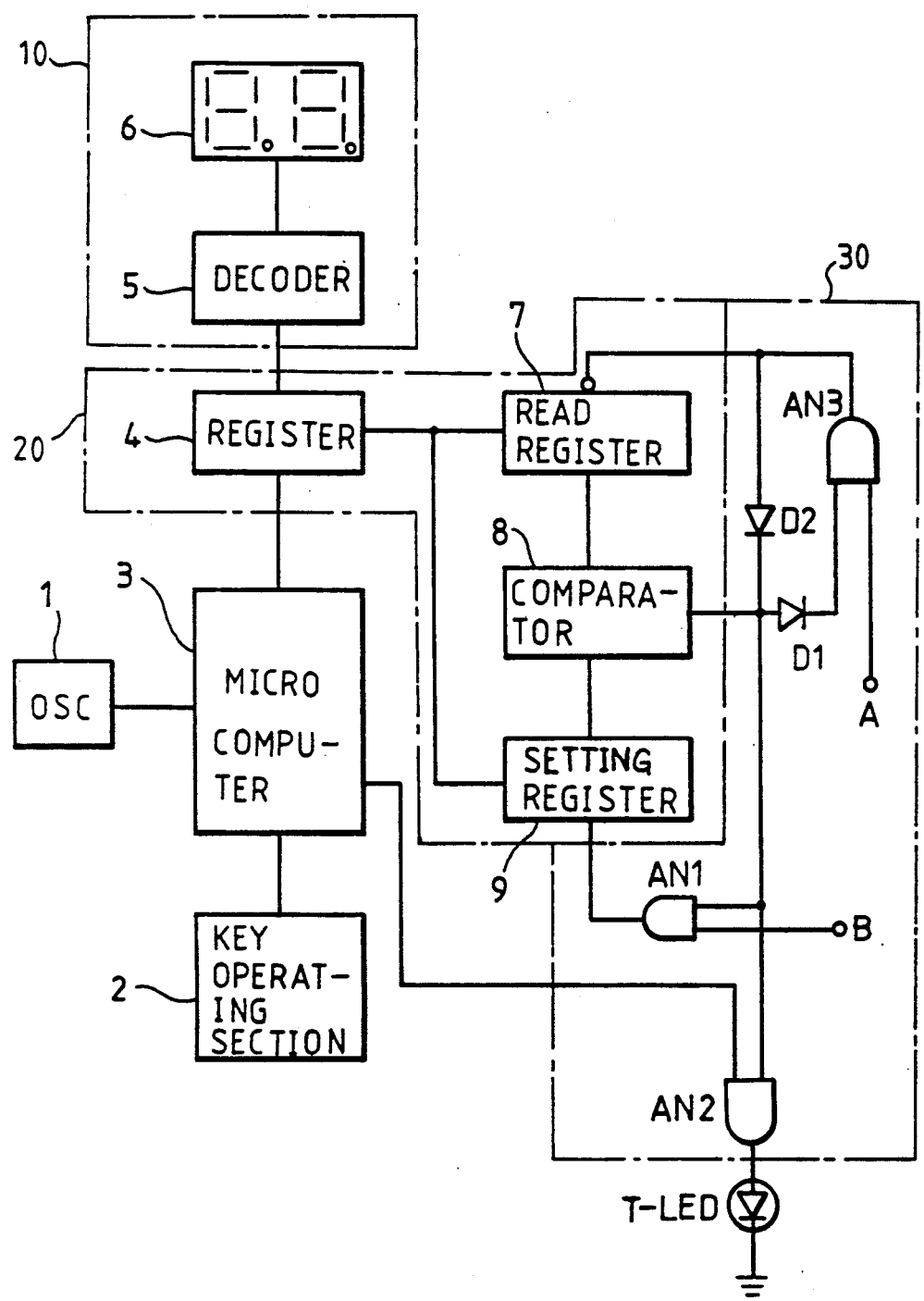
FIG. 1 is a circuital illustration of the preferred embodiment of the present invention.

As shown in FIG. 1, the operation control circuit for a remote control keypad according to the present invention includes; a microcomputer 3 for performing the controlling of the overall operations; an oscillator 1 for supplying reference clocks to the microcomputer 3; a key operating section 2 provided with keys such as a power key, ten keys and other function keys, and for carrying out encodings upon operation of the keys by the user to supply the encoded data to the microcomputer 3; a register 4 for storing the operating signals outputted from 3 in accordance with the manipulations of the keys of the key operating section 2; a decoder 5 for decoding the operation signals; and a display section 6 for displaying the decoded operation signals in the form of recognizable letters which are understandable in the eyes of the user. Decoder 5, together with display section 6 constitute a display stage 10. A read register 7 and a setting register 9 respectively set and read secret codes. A comparator 8 compares the signals from read register 7 and setting register 9, together with register 4, read register 7, comparator 8 and setting register 9 constitute a secret code comparing stage 20. Three AND gates AN1, AN2 and AN3 and two diodes D1 and D2 for receive the output of comparator 8 and supply an operation signal from microcomputer 3 to a transmission diode T-LED if the output of comparator 8 is ONE. The three AND gates AN1 to AN3 and the two diodes D1 and D2 together constitute a gating stage 30. The key operating section 2 may be desirably provided with a secret code setting key and a secret code read key in addition to the usually provided keys.

The register 4 is connected to a read register 7 and a setting register 9 respectively for setting and reading of secret codes, while a comparator 8 is installed at the output sides of the read register 7 and the setting register 9 in order to make judgements on the correspondence between the signals from the two registers 7,9. If the output of the comparator 8 is "1", then the operation signal from the microcomputer 3 will be supplied to a transmission diode T-LED.

Three AND gates AN1,AN2,AN3 are provided so that, during the setting and reading of the secret codes, the output from the register 4 should be shifted to the two registers 7,9, should be stored there, and compared with each other. Each of the AND gates receives the output of the comparator 8. Specifically, the first AND gate AN1 receives input data "1" from an input terminal B only during the operation of the secret code setting key, the second AND gate AN2 receives the output of the microcomputer 3, and the third AND gate AN3 receives input data "1" from an input terminal A only during the operation of the secret code read key.

The operation control circuit for a remote control keypad according to the present invention constituted as above will now be described as to its operation.

First, the secret codes will be set in such manner that the user will push the secret code setting key of the key operating section 2, then the respective registers 4,7,9 will be cleared to an initialization, and at the same time, a data "1" will be inputted into the input terminal B, and the comparator 8 will output "1" to supply it to the input sides of the AND gates AN1,AN2,AN3 because the cleared state of the two registers 7,9 are the same as each other. Accordingly, the first AND gate AN1 receives "1" from both the input terminal B and the comparator 8, and therefore, "1" will be outputted to the register 9 so that the register 9 should be enabled.

Then, if the user pushes the ten keys to input certain secret codes, the output signal generated therefrom will be supplied through the microcomputer 3 to the register 4, and then, the signals will be stored into the enabled setting register 9, while, at the same time, the signals will be decoded by the decoder 5 to be displayed on the display section 6.

After the setting of the secret codes, the secret code will be read in order to activate the passively controlled apparatus in the following manner. If the user pushes the secret code read key of the key operating section 2, then "1" will be inputted into the input terminal A of the third AND gate AN3 to be outputted in the form of "0", and it will be inverted again to "1" by the inverting input of register 7, so that the read register 7 should be enabled.

Then, if secret codes are inputted by pushing the ten keys of the key operating section 2, then the output signals generated therefrom will be supplied through the microcomputer 3 to the register 4 to be stored there, and at the same time, the same output signals will be supplied through the decoder 5 to the display section 6 to be displayed there. The signal data which has been stored in the register 4 will be transferred to the enabled read register 7 to be stored there, while the input terminal B AN1 will hold "0" and the setting register 9 will be in a disabled state, and therefore, it will keep storing the secret codes set before.

The secret code signals supplied from the read register 7 and the set secret code signals supplied from the setting register 9 are compared with each other by comparator 8, and if the two signals correspond to each other, "1" is outputted. Then, when both signals applied to AND gate AN2 from the microcomputer 3 and from the comparator 8 are respectively "1", "1" is output from AN2 to activate the transmission diode T-LED, and the transmission diode T-LED accordingly generates proper infrared ray signals, thus supplying control signals to the passively controlled apparatus.

On the other hand, if the signals from the two registers 7,9 are different from each other, that is, if codes different from the set secret codes are inputted, then the comparator 8 will output "0" and the second AND gate AN2 will output "0", so that the transmission diode T-LED should not be activated, and the passively controlled apparatus can not be activated.

Once the secret codes are read by the circuit, no further inputting of the secret codes is required, but the device can be used as in the case of the ordinary remote control keypad. That is, if the user switches over the secret code read key of the key operating section 2, to "ON" state then "1" will be inputted into the input terminal A of the third AND gate AN3, and the identicality of the signals stored in the two registers 7,9 will cause the comparator 8 to output "1", so that the second AND gate AN2 should continuously output "1", thereby making it possible to operate the remote control keypad without any additional inputting of the secret codes.

The remote control keypad according to the present invention can be constituted not only in the above described manner, but also in other different ways. That is, the secret code read key of the switching-over type can be replaced with a latch circuit, and it can be constituted such that re-inputting of the secret codes or inputting of another type of a secret codes should be required when operating a particular function key or selecting a particular channel. In the case of video apparatuses, for example, the user who is not informed of the secret codes can be allowed to use only the tuner function, while the security-demanding functions or the cost-incurring functions such as CCTV or video text are made to be operable by only certain particular persons.

As described above, according to the device of the present invention, the users who are not informed of the secret codes are not allowed the use of the device or are allowed only limited uses of the device. Therefore, the security of the remote controlled (passively controlled) apparatus is assured, and the undesirable uses of the apparatus by certain persons can be prevented.

There is a further advantage that, without observing the display means for the operation state of the apparatus, the remote control can by carried out only be manipulating the keypad.

What is claimed is:

1. An operation control circuit for a remote control keypad having a key operating section, a microcomputer for outputting operation signals in accordance with the operation of said key operating section and an oscillator for supplying reference clocks to the microcomputer, for use with an audio and video apparatus, said operation control circuit comprising:
   means for receiving the operational signals;
   display means coupled to said receiving means, for decoding said operation signals of said microcomputer, and for displaying said operation signals in a visual display;
   secret code comparing means coupled to said receiving means, for setting secret codes received from the key operating section and the microcomputer via said receiving means, and for comparing incoming codes received through said key operating section and the microcomputer with said secret codes; and gating means coupled to said secret code comparing means, for transmitting operation signals of said microcomputer to a remote control signal receiver of the audio and video apparatus when said incoming codes and said secret codes are found to correspond to each other by said secret code comparing means.

2. The operation control circuit for a remote control keypad as claimed in claim 1, wherein:
said receiving means comprises first register means for storing the operation signals output from the microcomputer in accordance with manipulations by a user of the keys of a key operating section; and
said secret code comparing means comprises:
setting register means for storing the secret codes;
read register means for storing the incoming codes; and comparator means for performing comparisons to check correspondence between the secret codes and the incoming codes from said setting register means and said read register means.

3. The operation control circuit for a remote control keypad as claimed in claim 1, wherein
said receiver means comprises first register means for storing the operation signals outputted from the microcomputer in accordance with manipulations by a user of the keys of the key operating section; and
said display means comprises:
decoder means for decoding operation signals stored in the first register means; and
means for displaying the decoded operation signals in the form of recognizable letters.

4. The operation control circuit for a remote control keypad as claimed in claim 2, wherein said display means comprises:
decoder means for decoding operation signals stored in the first register means; and
means for displaying the decoded operation signals in the form of recognizable letters.

5. The operation control circuit of claim 1, wherein said gating means comprises:
first logic means having a first input port coupled for receiving code setting signals from the key operating section and a second input port coupled to a first node to receive comparison signals from said comparing means;
second logic means having a first input port coupled to receive said operational signals and a second input port coupled to said first node; and
third logic means having a first input port coupled to receive code reading signals from the key operating section and a second input port coupled to said first node.

6. The operation control circuit of claim 2, wherein said gating means comprises:
first logic means having a first input port coupled for receiving code setting signals from the key operating section and a second input port coupled to a first node to receive comparison signals from said comparator means;
second logic means having a first input port coupled to receive said operational signals and a second input port coupled to said first node; and
third logic means having a first input port coupled to receive code reading signals from the key operating section and a second input port coupled to said first node.

7. The operation control circuit of claim 3, wherein said gating means comprises:
first logic means having a first input port coupled for receiving code setting signals from the key operating section and a second input port coupled to a first node to receive comparison signals from said comparing means;
second logic means having a first input port coupled to receive said operational signals and a second input port coupled to said first node; and
third logic means having a first input port coupled to receive code reading signals from the key operating section and a second input port coupled to said first node.

8. The operation control circuit of claim 4, wherein said gating means comprises:
first logic means having a first input port coupled for receiving code setting signals from the key operating section and a second input port coupled to a first node to receive comparison signals from said comparing means;
second logic means having a first input port coupled to receive said operational signals and a second input port coupled to said first node; and
third logic means having a first input port coupled to receive code reading signals from the key operating section and a second input port coupled to said first node.

9. The operation control circuit of claim 1, wherein said gating means comprises:
first logic means providing a first input port coupled for receiving code setting signals from the key operating section and a second input port coupled to a first node to receive comparison signals from said secret code comparing means, for applying first logic signals to said comparing means in dependence upon said code setting signals and said comparison signals;
second logic means providing a third input port coupled to receive said operational signals and a fourth input port coupled to said first node, for generating output signals in dependence upon said operational signals and said comparison signals; and
third logic means providing a fifth input port coupled to receive code reading signals from the key operating section and a sixth input port coupled to said first node, for applying second logic signals to said secret code comparing means in dependence upon said code reading signals and said comparison signals.

10. The operation control circuit of claim 2, wherein said gating means comprises:
first logic means providing a first input port coupled for receiving code setting signals from the key operating section and a second input port coupled to a first node to receive comparison signals from said comparator means, for applying first logic signals to said setting register means in dependence upon said code setting signals and said comparison signals;
second logic means providing a third input port coupled to receive said operational signals and a fourth input port coupled to said first node, for generating output signals in dependence upon said operational signals and said comparison signals; and
third logic means providing a fifth input port coupled to receive code reading signals from the key operating section and a sixth input port coupled to said first node, for applying second logic signals to said read register means and to said first node in dependence upon said code reading signals and said comparison signals.

11. The operation control circuit of claim 3, wherein said gating means comprises:
  first logic means providing a first input port coupled for receiving code setting signals from the key operating section and a second input port coupled to a first node to receive comparison signals from said secret code comparing means, for applying first logic signals to said secret code comparing means in dependence upon said code setting signals and said comparison signals;
  second logic means providing a third input port coupled to receive said operational signals and a fourth input port coupled to said first node, for generating output signals in dependence upon said operational signals and said comparison signals; and
  third logic means providing a fifth input port coupled to receive code reading signals from the key operating section and a sixth input port coupled to said first node, for applying second logic signals to said secret code comparing means in dependence upon said code reading signals and said comparison signals.

12. The operation control circuit of claim 4, wherein said gating means comprises:
  first logic means providing a first input port coupled for receiving code setting signals from the key operating section and a second input port coupled to a first node to receive comparison signals from said comparator means, for applying first logic signals to said setting register means in dependence upon said code setting signals and said comparison signals;
  second logic means providing a third input port coupled to receive said operational signals and a fourth input port coupled to said first node, for generating output signals in dependence upon said operational signals and said comparison signals; and
  third logic means providing a fifth input port coupled to receive code reading signals from the key operating section and a sixth input port coupled to said first node, for applying second logic signals to said read register means and to said first node in dependence upon said code reading signals and said comparison signals.

13. The operation control circuit of claim 2, wherein said gating means receives code setting and code reading signals from the key operating section, comparison signals from said comparator means, and said operational signals from the microcomputer, applies first logic signals to said setting register means in dependence upon said code setting signals and said comparison signals, generates output signals in dependence upon said operational signals and said comparison signals, and applies second logic signals to said read register means in dependence upon said code reading signals and said comparison signals.

14. The operation control circuit of claim 4, wherein said gating means receives code setting and code reading signals from the key operating section, comparison signals from said comparator means, and said operational signals from the microcomputer, applies first logic signals to said setting register means in dependence upon said code setting signals and said comparison signals, generates output signals in dependence upon said operational signal and said comparison signals, and applies second logic signals to said read register means in dependence upon said code reading signals and said comparison signals.

15. In a remote control circuit having a keypad and a microcomputer coupled to generate operation signals in response to input signals from the keypad, an operational control circuit comprising:
  first logic means providing a first input port coupled for receiving code setting signals from said keypad and a second input port coupled to a first node to receive comparison signals, for generating first logic signals at a first output port in dependence upon said code setting signals and said comparison signals;
  second logic means providing a third input port coupled to receive the operation signals and a fourth input port coupled to said first node, for generating control signals at a second output port in dependence upon said operation signals and said comparison signals;
  third logic means having a third output port coupled to said first node, and providing a fifth input port coupled to receive code reading signals from the keypad and a sixth input port coupled to said first node, for generating second logic signals at said third output port in dependence upon said code reading signals and said comparison signals;
  first register means for storing the operation signals from the microcomputer in accordance with manipulations by a user of the keys of said keypad;
  setting register means for storing, under control of said first logic signals, secret codes included among incoming code signals received from the keypad;
  read register means coupled to receive said second logic signals, for storing the incoming code signals received from the keypad via said first register means;
  comparator means for generating said comparison signals at said first node after performing comparisons between the secret codes and the incoming code signals stored by said respective setting register means and read register means;
  decoder means for decoding operation signals stored in the first register means; and
  display means coupled to said decoder means, for displaying decoded operation signals in the form of recognizable 16. A remote control circuit, comprising:
  a keypad;
  a microcomputer coupled to generate operation signals in response to input signals from the keypad;
  first logic means providing a first input port coupled for receiving code setting signals from said keypad and a second input port coupled to a first node to receive comparison signals, for generating first logic signals at a first output port in response to coincidence between logic states of said code setting signals and said comparison signals;
  second logic means providing a third input port coupled to receive the operation signals and a fourth input port coupled to said first node, for generating control signals at a second output port in response to coincidence between logic states of said operation signals and said comparison signals;
  third logic means having a third output port coupled to said first node, and providing a fifth input port coupled to receive code reading signals from the keypad and a sixth input port coupled to said first node, for generating second logic signals at said third output port in response to coincidence between logic states of said code reading signals and said comparison signals;

first register means for storing operation signals from the microcomputer in accordance with manipulations by a user of the keys of said keypad;

setting register means for storing, under control of said first logic signals, secret code signals included among input signals received from said keypad via said first register means;

read register means coupled to receive said second logic signals, for storing incoming code signals included among said input signals received from said keypad via said first register means;

comparator means for generating said comparison signals after performing comparisons to check correspondence between the stored secret code signals and the stored incoming code signals;

a first diode coupled to transmit said comparison signals to said first node;

a second diode coupled to transmit said second logic signals between said third output port and said first node;

decoder means for decoding said operation signals stored in the first register means; and display means coupled to said decoder means, for displaying decoded operation signals in the form of recognizable symbols.

* * * * *

UNITED STATES PATENT AND TRADEMARK OFFICE
CERTIFICATE OF CORRECTION

PATENT NO. : 5,097,260
DATED : 17 March 1992
INVENTOR(S) : Yun-Soon AHN

It is certified that error appears in the above-identified patent and that said Letters Patent is hereby corrected as shown below:

Column 4, Line 46, replace "by" with --be--, and replace "be" with --by--.

Signed and Sealed this

Fifth Day of October, 1993

Attest:

BRUCE LEHMAN

Attesting Officer

Commissioner of Patents and Trademarks